United States Patent [19]
Levinson

[11] Patent Number: 5,796,361
[45] Date of Patent: Aug. 18, 1998

[54] CCD SIGNAL DIGITIZING INTEGRATED CIRCUIT

[75] Inventor: Roger Levinson, Sunnyvale, Calif.

[73] Assignee: Exar Corporation, Fremont, Calif.

[21] Appl. No.: 719,939

[22] Filed: Sep. 25, 1996

[51] Int. Cl.$^6$ ............................................. H03M 1/12
[52] U.S. Cl. .......................... 341/172; 341/100; 341/155
[58] Field of Search ........................ 341/100, 1, 155, 341/172; 348/294, 312, 311

[56] References Cited

U.S. PATENT DOCUMENTS

| | | | |
|---|---|---|---|
| 4,353,057 | 10/1982 | Bernet et al. | 340/347 |
| 4,943,850 | 7/1990 | Asaida | 358/55 |
| 4,967,198 | 10/1990 | Seckora | 341/150 |
| 5,502,578 | 3/1996 | Smitt | 358/474 |
| 5,625,414 | 4/1997 | Manning | 348/312 |

Primary Examiner—Jeffrey A. Gaffin
Assistant Examiner—Peguy Jean Pierre
Attorney, Agent, or Firm—Townsend and Townsend and Crew LLP

[57] ABSTRACT

Various innovative circuit techniques that make possible a single chip, cost effective implementation of a CCD signal digitizing circuit are disclosed. Among the various features of the single chip digitizing circuit is the use of a single clock to sample the CCD signal and to digitize the analog signal. By providing a tight control over the minimum required settling time delay at the input of the analog to digital converter (ADC), the speed of the circuit is optimized. Other features include support for various modes of CCD operations, reference voltage feedback from ADC to sampling circuit to compensate for offset voltage, dual register serial input/output circuit, and multiplexed ADC input.

14 Claims, 4 Drawing Sheets

CCD SIGNAL DIGITIZING INTEGRATED CIRCUIT

BACKGROUND OF THE INVENTION

The present invention relates in general to imaging systems, and in particular to monolithic implementation of a digitizing system for charge coupled device (CCD) signals.

Charge coupled devices are made up of closely spaced arrays of capacitors that store charge representing analog or digital signals. The capacitors are typically of the semiconductor type where the charge is stored in the inherent junction capacitor. The MOS capacitors are built close enough together such that in response to voltage applied to their gates charge is freely transferred between adjacent storage channels. More elaborate CCD storage elements may employ silicon gates singly or in two or three levels.

A typical analog application for CCD arrays is in imaging systems. For this application, a whole field of CCD stages is biased into deep depletion and exposed to a focused image for a time interval. The generation of carriers under the CCD gate is enhanced during the exposure time according to the brightness of the image. The channel under each gate or "picture element" (pixel) therefore becomes charged to a level that represents the brightness at its location. The analog information is then clocked out to sense amplifiers that are typically built on the edges of the CCD image array. Designs similar to this are used for digital integrated circuit television cameras, scanners and the like.

The CCD analog output signal is a discrete time waveform an example of which is shown in FIG. 1. Referring to FIG. 1, the CCD output signal representing each pixel starts with a reset pulse which is followed by a reference level Vref supplied by the first phase of the clock. The reference level Vref corresponds to pixel information when no light is sensed and therefore establishes the reference voltage for the "dark" or "black" level. The reference level Vref can be anywhere between, for example, 3 to 8 volts. The next phase of the clock supplies the analog video signal containing the pixel brightness information. The difference between the level of the reference signal Vref and the level of the analog signal is the video signal Vsig.

For further processing, the CCD analog output signal is digitized by first measuring the difference signal Vsig, amplifying Vsig, and then applying it to an analog to digital converter. FIG. 2 shows a high level block diagram of a typical CCD signal digitizing system 100. A difference circuit 102 receives the CCD signal at an input and the CCD signal clocking information, and generates a difference signal at its output. Difference circuit 102 may use well known sample and hold techniques such as correlated double sampling to measure the difference signal Vsig. The signal Vsig is then amplified by a programmable gain amplifier (PGA) 104 whose output is fed into the input of a digital to analog converter (ADC) 106. The function of PGA 104 is to normalize Vsig with respect to the reference signal for ADC 106.

Existing CCD signal digitizing systems employ a variety of discrete implementations where, for example, the front end including difference circuit 102 and PGA 104 are integrated on one chip and ADC 106 on another. The resulting system uses a number of external components and is more costly. Performance considerations such as timing, offset and noise, as well as process technology and design techniques have up to now limited the implementation of such CCD digitizing systems to the more costly discrete solutions.

SUMMARY OF THE INVENTION

The present invention employs a number of innovative design techniques that allow monolithic implementation of a CCD signal digitizing system, and offer numerous novel and advantageous features that substantially improve the overall performance of such a system.

The fully integrated CCD signal digitizing system of the present invention uses a single system clock to run both the sample and hold function of the difference circuit and the analog to digital converter. Using the same clock makes it possible to optimize the speed and performance of the circuit by accurately controlling the amount of delay between when the output of the difference circuit becomes available and the sampling of the ADC. This clocking scheme is also used to provide isolation (buffering) between the sample/hold output node that tracks the analog input signal and the ADC input. This buffering removes some of the constraints and simplifies the design of the ADC.

By providing a black level sampling clock signal that is independent of the sample and hold clock, the circuit of the present invention is able to support several modes of operation. The circuit can be configured to receive a standard CCD signal in one mode which requires the sampling function to obtain the difference signal for each pixel. Alternatively, to support those CCDs that already incorporate the difference function, the circuit of the present invention can be configured to sample the DC value once (DC level shift) and to disable the reference level sampling function thereafter.

To address offset problems that may be caused by integrating the difference circuit/PGA and the ADC on the same chip running off a single supply, the invention includes a special circuit technique. The circuit of the present invention senses the ADC reference signal, shifts it by several LSBs to cover the offset of the difference circuit/PGA, and feeds it back to be used as the reference signal for the difference circuit/PGA. This scheme ensures that once the zero scale is calibrated, the offset will not cause loss of critical information around the zero level.

Another feature of the invention is a data I/O circuit that substantially reduces the number of pins. A bidirectional serial port that is used to output digital data and to receive system control data allows a single pin to serve several functions. The use of a serial port as opposed to parallel, and the bidirectional nature of the port dramatically reduces the number of required pins. The I/O circuit includes two separate shift registers such that the chip is capable of receiving control data input into a data input register as the ADC conversion continues to generate output data that is loaded into a data output register.

Yet another novel aspect of the monolithic implementation of a CCD signal digitizing system according to the present invention is a circuit coupled between the difference circuit/PGA output and the ADC input to allow external access to the input of the ADC. Among other advantageous features, this circuit makes the ADC available to service other system functions that require analog to digital conversion.

A better understanding of the nature and advantages of the present invention may be had with reference to the detailed description and drawings below.

DESCRIPTION OF SPECIFIC EMBODIMENTS

Figure 1:
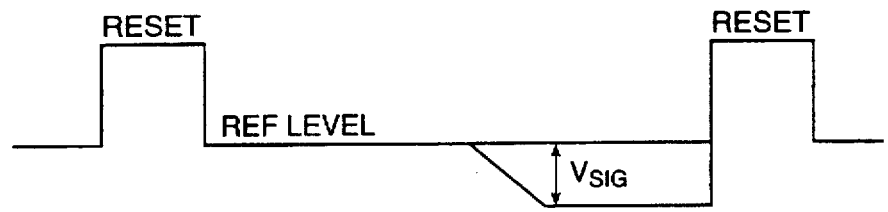
FIG. 1 is a discrete time waveform showing an example of a CCD analog output signal.
Figure 2:
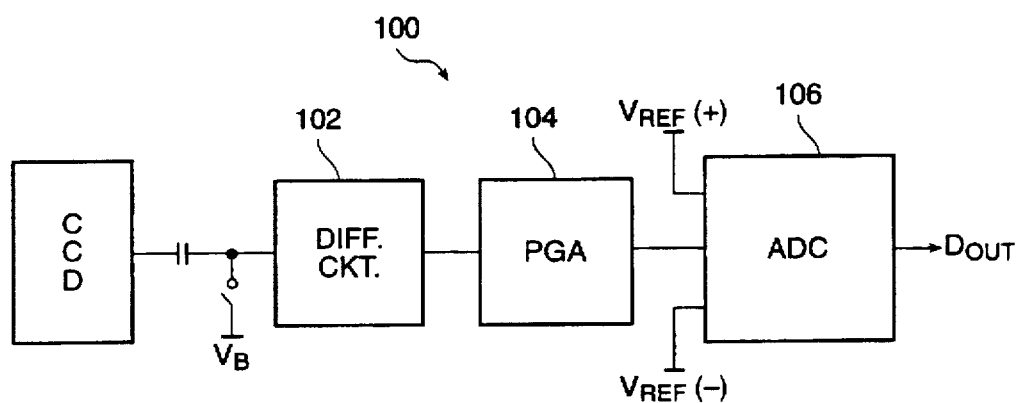
FIG. 2 is a high level block diagram of a typical CCD signal digitizing system.
Figure 3:
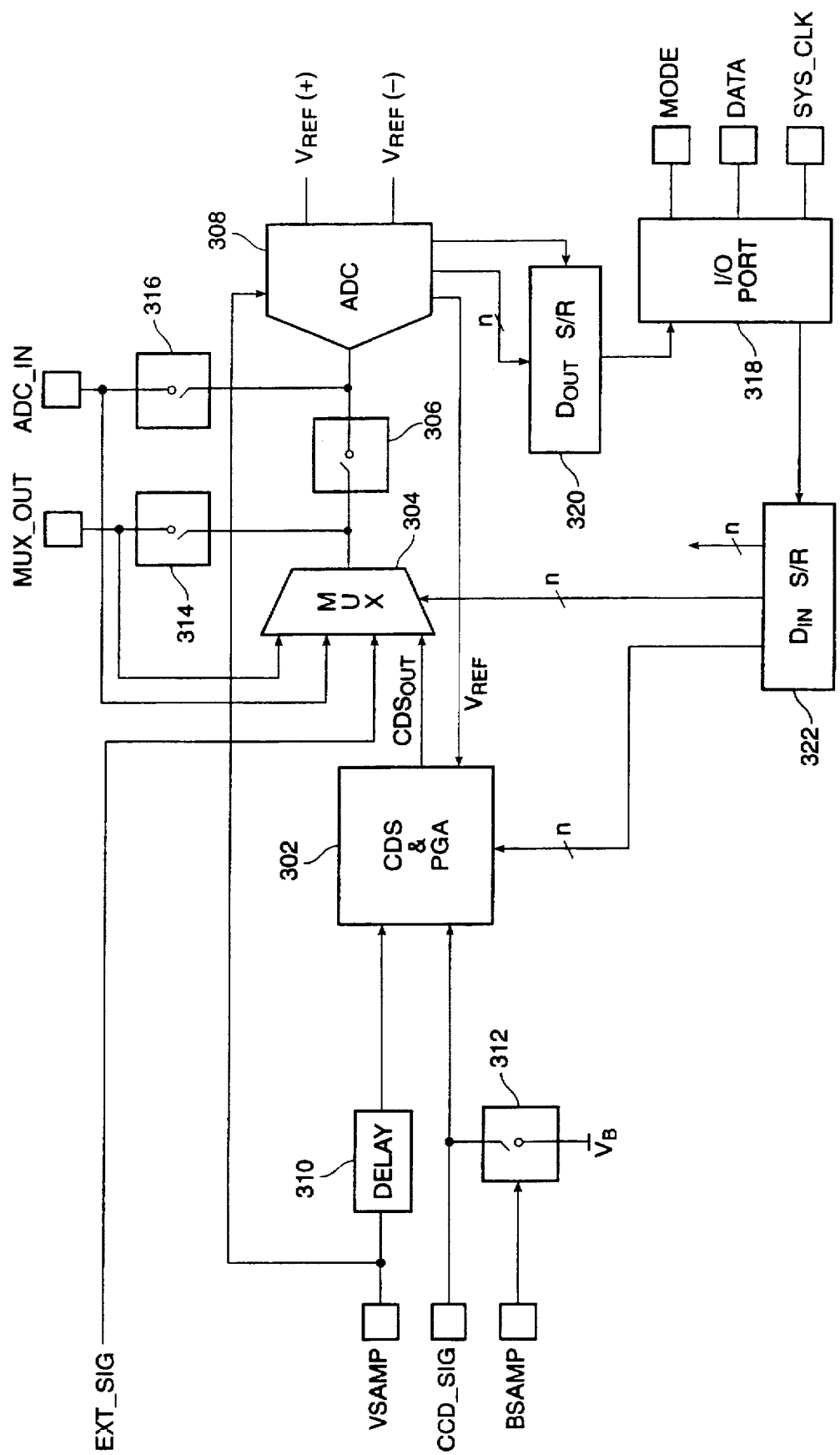
FIG. 3 is a block diagram of the single chip CCD signal digitizing circuit of the present invention.

Referring to FIG. 3, there is shown a block diagram of an embodiment the single chip CCD signal digitizing circuit according to the present invention. The CCD signal CCD_SIG is received by block CDS/PGA 302 that includes the difference function and the programmable gain control (PGA). The difference function is performed by correlated double sampling (CDS) technique which will be described in greater detail in connection with FIGS. 4 and 5. The output of CDS/PGA block 302 connects to an input of a multiplexer (MUX) 304, whose output drives the input of an analog to digital converter (ADC) 308 via a switch 306. Positive and negative reference signals $V_{ref(+)}$ and $V_{ref(-)}$ are externally supplied to ADC 308. A video sampling signal VSAMP is applied to both blocks ADC 308 directly and CDS/PGA 302 via a delay element 310. A programmable switch 312 connecting to CCD_SIG line receives a black (or reference) level sampling signal BSAMP as its control signal. The two terminals of programmable switch 306 connect to input pads MUX_OUT and ADC_IN via programmable switches 314 and 316, respectively. A reference signal $V_{ref}$ is supplied from ADC 308 to CDS/PGC 302. A data I/O pad DATA, mode select input pad MODE and clock input pad SYS_CLK connect to a bidirectional I/O port 318. A parallel in-serial out shift register Dout S/R 320 receives the multi-bit output of ADC 308 in parallel and supplies it to I/O port 318 serially. Bidirectional I/O port 318 also connects to a serial in-parallel out shift register Din S/R 322 that receives input data serially and supplies the data to the rest of the circuit in a parallel fashion. MUX 304 also receives MUX_OUT and ADC_IN pads at its inputs, as well as a plurality of external interconnects.

Clocking Scheme

The output of CDS/PGA 302 ($CDS_{out}$) is a waveform that is updated by a clock signal. For the circuit to operate properly, there must be enough time allowed for the $CDS_{out}$ signal to settle before it is sampled by ADC 308. The prior art typically uses a clock signal supplied by the CCD to sample and update CCD_SIG (generating $CDS_{out}$), and a separate system clock for ADC 308. The user then must make sure that the timing of the ADC sampling (system clock) is such that enough margin is provided for $CDS_{out}$ to settle.

Figure 4:
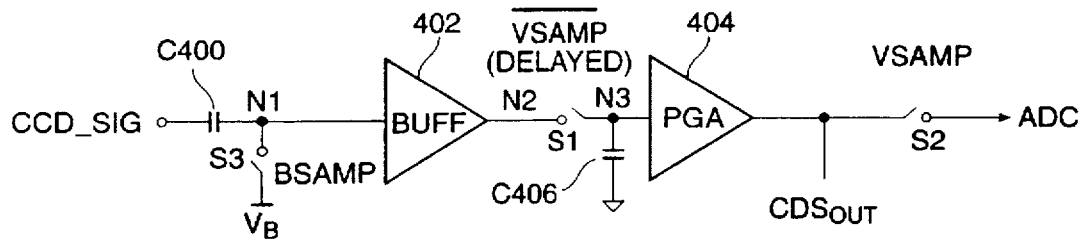
FIG. 4 is a simplified diagram showing the clocking scheme according to an embodiment of the invention.
Figure 6:
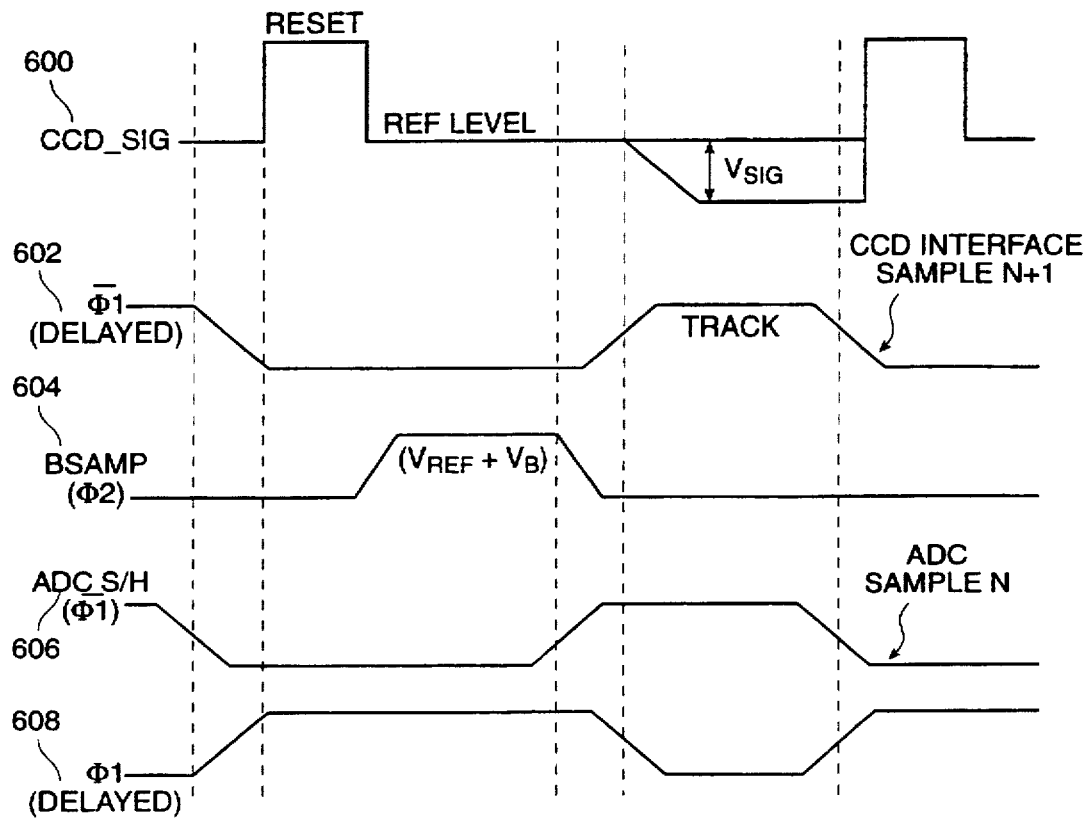
FIG. 6 is a timing diagram showing the clocking scheme of the present invention.

By integrating both the CDS/PGA and ADC functions on the same chip and running both circuits off the same clock (VSAMP), the present invention provides a built-in margin with the minimum required delay and thus maximizes the speed of the circuit. As shown in FIG. 3, the signal VSAMP connects to both blocks CDS/PGA 302 via delay element 310, and ADC 308 directly. FIG. 4 illustrates the single clock scheme that is used to control the timing of the correlated double sampling and the ADC function in greater detail. Switch S3 samples the reference (or block/dark) level of the input signal CCD_SIG that is coupled across capacitor C400. Referring to FIG. 6, waveform 604 shows the signal BSAMP ($\phi$2) that controls switch S3. Switch S3 is closed (BSAMP on) during the reference level (after the reset pulse and before the video signal portion) of signal CCD_SIG (waveform 600). When S3 is closed, bias voltage $V_B$ is coupled to node N1. Thus, node N1 stores the CCD_SIG reference level plus bias voltage $V_B$.

Switch S3 is opened (BSAMP turned off) just before the signal portion of the CCD_SIG begins. The input signal CCD_SIG across capacitor C400 drives the input of buffer 402 (node N1) which in turn drives node N2. With switch S1 closed ($VSAMP_{delayed}$ on), the signal on node N2 couples to node N3, and through PGA 404 to the output $CDS_{out}$. Thus, with BSAMP off and $VSAMP_{delayed}$ on, $CDS_{out}$ tracks the input signal CCD_SIG. The signal is applied to the ADC input via switch S2 that is closed by VSAMP being on. As soon as switch S1 opens, the signal on node N2 is sampled on capacitor C406.

$CDS_{out}$ continues to hold its value until switch S1 is closed again to update the information. Therefore, to maximize the amount of settling time for $CDS_{out}$, switch S2 should be opened just before switch S1 is closed. That ensures the longest period of time for the ADC to sample the signal $CDS_{out}$ before it is updated. Accordingly, instead of using separate clocks to control switches S1 (e.g., CCD clock) and S2 (e.g., ADC clock), the present invention accomplishes this by using the same clock VSAMP and its delayed inverse $VSAMP_{delayed}$. Using the same clock in this fashion enables the designer to optimize the speed of the circuit by providing the maximum settling time with minimum delay.

Figure 5:
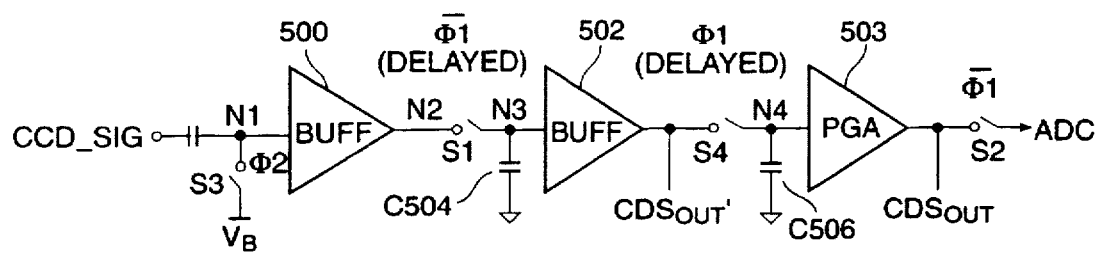
FIG. 5 shows a modification of the circuit of FIG. 3 wherein a buffer isolates the ADC input from the tracking node of the difference circuit.

To further enhance the performance of this circuit, a second sample/hold stage can be inserted in the signal path forming an analog flip flop that isolates the tracking node from the ADC input. FIG. 5 shows an alternate embodiment with such an analog flip flop. This circuit essentially adds a buffer 502, switch S4 and capacitor C506 (a second sample/hold stage) to the circuit of FIG. 4. The function of this added circuitry is to isolate the tracking node N3 from the ADC input ($CDS_{out}$), so that $CDS_{out}$ need not track and settle. In operation, just as in a flip flop where the second stage holds as the first stage is updated by new data, $CDS_{out}$ updates on the falling edge of $\phi$1 bar and is given an entire clock cycle to settle before sampled by the ADC, while ($CDS_{out}$)' tracks the next CCD_SIG signal. Thus, $CDS_{out}$ does not have to track the signal and settle, it only receives and has to settle from a step input. This technique provides a faster operation as the tracking bandwidth is minimized.

The circuit functions as follows. The CCD reference signal sampling is performed as described above using the BSAMP signal. $CDS_{out}$ tracks the analog input, $V_{sig}$, while $\phi1_{delayed}$ is low. On the rising edge of $\phi1_{delayed}$ $CDS_{out}$ holds $V_{sig}$ which is applied to the input of the PGA. The output of the PGA then settles to a new value which is held when $\phi1_{delayed}$ goes low. On the next rising edge of $\phi$1, the ADC samples the PGA output just before it is updated into the next signal valve. This function provides the PGA with the maximum settling time possible.

User Controlled Black Level Sampling

In many prior art implementations the clock (BSAMP) that samples the black or reference level of CCD_SIG, is derived from the same clock that samples the video signal portion of CCD_SIG. Typically, in these implementations the reference (black) level is sampled for every pixel. There are, however, CCD circuits that have already incorporated the correlated double sampling function and therefore the CCD_SIG supplied by such circuits need not go through black level sampling. The typical prior art systems therefore can not interface with this type of CCD circuist.

The CCD signal digitizing circuit of the present invention separates the black level sampling clock BSAMP from the video sampling clock VSAMP, and allows the user to independently control both. Thus, as shown in FIG. 3, separate input pads are provided for BSAMP and VSAMP. The user can configure the circuit to interface with various types of CCD circuits. The user has the option of disabling BSAMP and allowing the CCD_SIG to go through the PGA and ADC blocks without under going the CDS operation. In another mode, the user can sample CCD_SIG black level once and use that as the reference voltage for all subsequent pixels. Finally, the user can provide a BSAMP pulse for every pixel to process standard CCD_SIG signals. This flexibility allows the circuit to interface with different types of CCD circuits.

Offset Compensation

The performance of the CCD signal digitizing system is significantly impacted by any offset voltage that may exist between the reference levels for the ADC and the CDS/PGA circuitry. For accurate operation, it is critical that the reference or ground level at the output of the CDS/PGA circuit correspond to the negative reference level $V_{ref(-)}$ of the ADC. If, for example, the $V_{ref(-)}$ level were fed back and used as the reference level for the CDS/PGA block, a slight negative offset in the CDS/PGA block may equate the black (reference) level at the CDS/PGA output to a voltage below $V_{ref(-)}$. This would result in the ADC detecting "0" until the input CCD_SIG rises above the negative offset, after which codes will be generated. Thus, small CCD_SIG signals around the "0" level, which in CCD applications is often the most valuable information, is lost due to the offset.

In the prior art discrete implementations, because discrete parts with varying power supplies can be used, there is more flexibility in addressing the offset problem. For example, an operational amplifier running off of ±5 volt supplies can be used to drive the output of the CDS/PGA circuit, with an ADC that uses ground as the reference voltage. In a single chip implementation with, for example, a single 5 volt supply voltage, using ground ("0") as the reference voltage is not a practical option. Typically, $V_{ref(+)}$ and $V_{ref(-)}$ for the ADC in a single 5 volt chip are not set at 5 volts and ground, respectively. Usually, $V_{ref(-)}$ is somewhere slightly above ground (e.g., 0.5 volts). However, the circuit must still ensure that when CDS/PGA output is at zero, the negative ADC reference voltage $V_{ref(-)}$ is selected.

Figure 7:
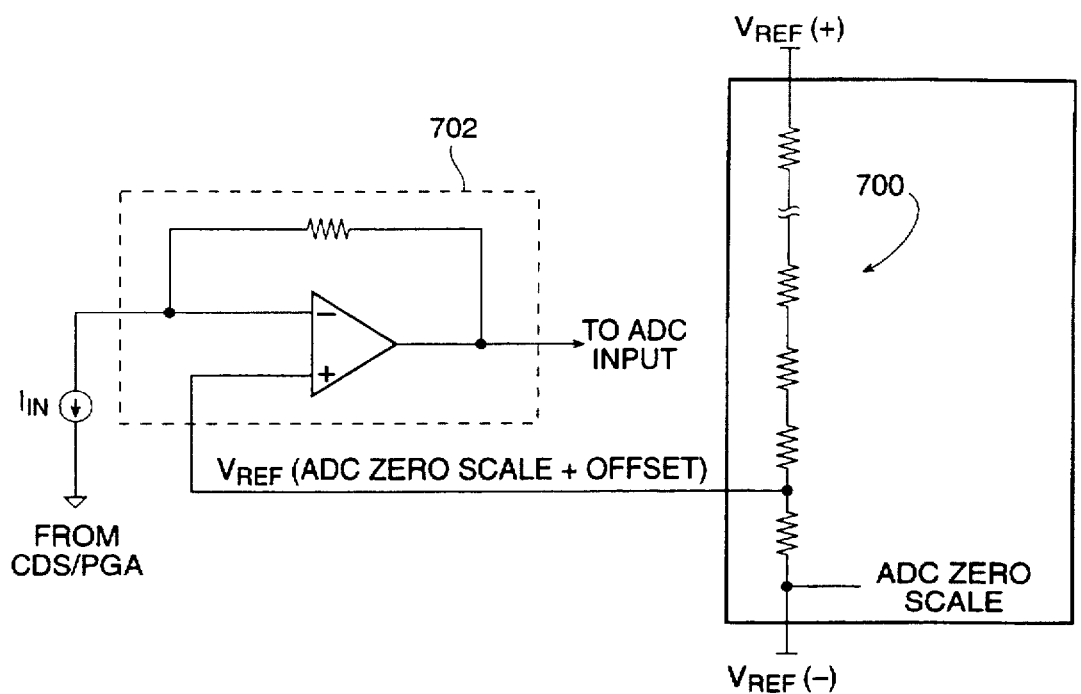
FIG. 7 is a simplified circuit schematic that illustrates the offset feedback technique of the present invention in greater detail.

FIG. 7 is a simplified schematic diagram illustrating the offset compensation technique of the present invention. The ADC includes an internal resistive voltage divider 700 that is connected between the two reference voltages $V_{ref(-)}$ and $V_{ref(+)}$. Resistive voltage divider 700 divides the voltage between the two reference levels into a number of well defined sub voltage levels that correspond to digital codes. The present invention determines how many least significant bits (LSBs) the measured or calculated offset of the CDS/PGA circuit corresponds to, and then uses the sub voltage level from resistor string 700 that corresponds to that particular code to set the zero scale for the CDS/PGA circuit.

For example, if the offset is calculated to be 40 mV, and 40 mV corresponds to 4 LSBs, then the voltage level equal to $V_{ref(-)}$ plus 4 LSBs is tapped off resistor string 700 and fed back as the reference voltage for CDS/PGA circuit. The amount by which $V_{ref(-)}$ is shifted up is arbitrary as long as it covers the CDS/PGA offset The system is then calibrated to establish the zero scale. Preferably, however, $V_{ref(-)}$ is shifted by the minimum number of LSBs to cover the offset to maximize the dynamic range of the system. As shown in FIG. 7, the signal from the CDS/PGA circuitry is driven by a buffer 702 whose reference voltage connects to a tap in ADC's resistor string 700.

Bidirectional Serial Port

In a system that processes both analog and digital signals, digital feedthrough and crosstalk is a source of noise that may contaminate sensitive analog signals. Such noise becomes more of a concern when the two types of circuitry are integrated on the same chip. In the case of the CCD signal digitizing integrated circuit of the present invention the analog CCD input signal is processed by the CDS/PGA circuitry on the same chip as the digitized output of the ADC and the various clock signals. The input/output (I/O) circuitry is the source of most of this type of feedthrough noise.

The prior art systems typically use a parallel output structure where, for example, eight pins supply the digital output in one clock cycle. Thus, the circuit generates a large amount of noise but at one time. With the knowledge of the timing of the noise, the system is designed such that when the digital word is outputted the analog signals are not vulnerable to noise. This approach, however, requires several (e.g., eight) dedicated digital output pins, which can be costly.

Figure 8:
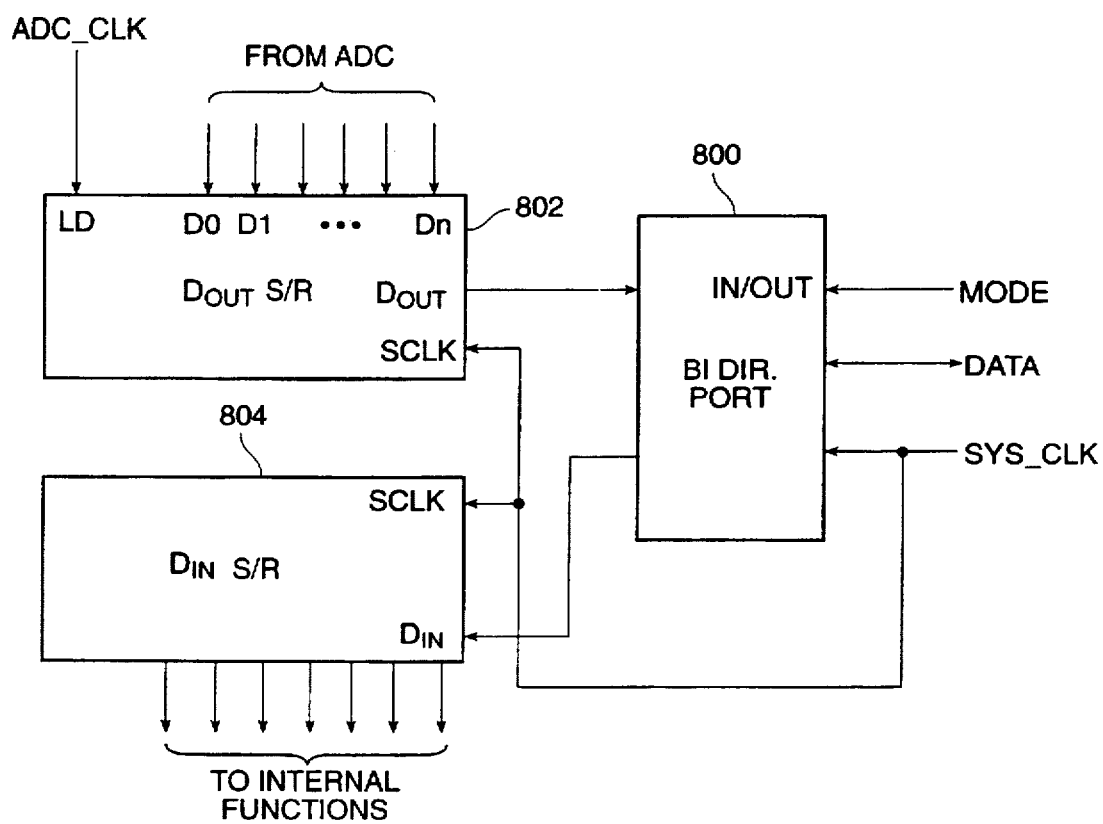
FIG. 8 shows the dual register I/O circuitry including the bidirectional I/O port according to this invention.

With an approximately 1 to 4 Meg pixel rate for typical CCD applications, serial processing of data is an option. The present invention uses a serial output structure requiring a single data pin. A bidirectional output buffer in combination with a dual register I/O data processing circuitry, provides a much more flexible and cost effective solution that also addresses the noise problem. Referring to FIG. 8, the I/O circuitry for the CCD signal digitizing integrated circuit of the present invention is shown in greater detail. A bidirectional port 800 connects to a DATA pad and a MODE pad. A parallel to serial shift register Dout S/R 802 receives the ADC output data in parallel and shifts out the data serially to bidirectional port 800. Dout S/R 802 also receives a system clock signal SYS_CLK and a clock signal ADC_CLK from the ADC. A serial to parallel shift register Din S/R 804 receives data from bidirectional port 800 at a Din terminal and supplies the data in parallel to the rest of the circuit. Din S/R 804 also receives the system clock SYS_CLK. The two shift registers 802 and 804 may be of different lengths. The signal SYS_CLK is supplied by the user and controls the overall I/O timing for port 800 and shift registers 802 and 804.

The I/O circuitry of the present invention as shown in FIG. 8 offers a number of advantages. This scheme requires only one DATA pin and a second pin for he clock signal SYS_CLK. This dramatically reduces the number of pins and hence the cost of manufacture. It further limits the number of sources for noise as there is only one digital DATA pin and a clock pin as opposed to, for example, eight digital data pins. The single digital DATA pin would be active for a longer period of time, but the circuit is timed such that the sensitive analog signals are not impacted in the period during which digital data is outputted. Placing the timing of the I/O circuitry (SYS_CLK) in the control of the user makes the system much more flexible. For example, the various imaging systems in which this CCD digitizing integrated circuit may be used may have different speed requirements. The signal SYS_CLK allows the circuit of the present invention to be optimized by the user for each environment.

Also, the I/O data can be processed asynchronously with respect to the internal analog clocking (CDS/PGA and ADC timing). In addition to SYS_CLK that shift the data, Dout S/R 802 receives a clock signal ADC_CLK from the ADC. Thus, output shift register Dout S/R 802 can be automatically updated by the ADC, while the shifting of data output to port 800 is controlled by a separate SYS_CLK.

Further advantages are realized by the bidirectionality of port 800. this feature of the present invention allows the same pin DATA to receive input data as an input pin and to supply output data as an output pin. MODE pin controls the in/out mode of operation. Thus, DATA pin can serve as an input pin that receives control data to configure the circuit. For example, gain control data for the PGA, and other control signals (e.g., MUX select inputs, switch control terminals, test purposes, etc.) can be supplied through DATA pin. port 900 and Din S/R 804. The provision of two separate registers enables the system to receive and load such input data as the ADC continues to generate digital code and load Dout S/R 802.

ADC Input Multiplexing

Some imaging systems may have other functions that can be performed by the ADC, such as temperature sensing or other system diagnostic functions. The circuit of the present invention inserts a multiplexer between the CDS/PGA output and the ADC input and provides external access to the input of the ADC in a novel fashion. Referring to FIG. 3, when switch 306 is opened and switch 316 closed, ADC 308 is effectively disconnected from the video channel. An additional input pin ADC_IN allows an external device to access the input of ADC 316.

The circuit further provides a second pin MUX_OUT that connects to the output of MUX 304 via programmable switch 314. Thus, when switch 306 is opened, and switches 314 and 316 closed, the circuit provides the option of inserting an external device along the video channel. This can be useful, for example, if it is desired to increase the gain by some factor more than the PGA can provide. In that case, external gain block can be placed between CDS/PGA 302 and ADC 308.

Programmable switches 312 and 314, when opened, disconnect any noise on the external pins MUX_OUT and ADC_IN from the signal path, and also allow these two pins to be used as input terminals to MUX 304. In addition to these two pins, MUX 304 receives other external signals as inputs. This provides further the option of sharing resources by several devices. For example, in a system that has several video channels, if a buffering is required for each channel, this circuit allows one buffer to serve all channels through MUX 304 and pins MUX_OUT and ADC_IN. Another advantage of providing external access to the ADC input and MUX output is that various blocks within the system can be easily tested individually.

In conclusion, the present invention provides several innovative circuit techniques that make possible full integration of the CCD signal sampling and amplification analog functions and the digitizing function on a single chip. While the above is a complete description of a specific embodiment of the present invention, various modifications, variations and alternatives may be employed. The scope of this invention, therefore, should not be limited to the embodiments described, and should instead be defined by the following claims.

What is claimed is:

1. A charge coupled device (CCD) signal digitizing circuit comprising:

a CCD analog signal processing circuit including a sampling unit coupled to an amplifier, said CCD analog processing circuit having an input coupled to receive a CCD input signal, and an output;

an analog to digital converter (ADC) having an input coupled to said output of said CCD analog signal processing circuit, and a plurality of digital outputs; and a CCD signal reference level sampling circuit coupled to said input of said CCD analog signal processing circuit, said CCD signal reference level sampling circuit receiving a third clock signal from a second clock source that is separate and independent of said first clock source wherein, said CCD analog signal processing circuit and said ADC are integrated on a single chip, and wherein a first clock signal for said CCD analog signal processing circuit and a second clock signal for said ADC are of substantially the same frequency and are generated by a first clock source.

2. The CCD signal digitizing circuit of claim 1 wherein said clock source is externally provided and wherein said first clock signal for said CCD analog signal processing circuit is delayed with respect to said second clock signal for said ADC.

3. The CCD signal digitizing circuit of claim 2 wherein said sampling unit is a correlated double sampling circuit, said correlated double sampling circuit including a first and a second sampling stage clocked to form an analog flip flop.

4. The CCD signal digitizing circuit of claim 1 wherein said ADC comprises a resistive voltage divider coupled between a first reference voltage and a second reference voltage, and wherein, a point along said resistive divider is tapped and fed back to said CCD analog signal processing circuit to establish a reference voltage for an output signal of said CCD analog signal processing circuit.

5. The CCD signal digitizing circuit of claim 1 further comprising a multiplexer having a first input coupled to said output of said CCD analog signal processing circuit, a second input coupled to receive a signal external to said chip, and an output coupled to said input of said ADC, wherein said signal external to said chip may be any type of analog signal including an output of a temperature sensor or other system diagnostic device.

6. The CCD signal digitizing circuit of claim 5 further comprising a first programmable switch coupling said output of said multiplexer to said input of said ADC.

7. The CCD signal digitizing circuit of claim 6 further comprising a second programmable switch coupling said output of said multiplexer to a first pad, and a third programmable switch coupling said input of said ADC to a second pad.

8. The CCD signal digitizing circuit of claim 7 wherein said multiplexer further includes third and fourth inputs respectively coupled to said first and second pad, and a fifth input coupled to receive an external signal.

9. A charge coupled device (CCD) signal digitizing circuit comprising:

a CCD analog signal processing circuit including a sampling unit coupled to an amplifier, said CCD analog processing circuit having an input coupled to receive a CCD input signal, and an output;

an analog to digital converter (ADC) having an input coupled to said output of said CCD analog signal processing circuit, and a plurality of digital outputs, wherein, said CCD analog signal processing circuit and said ADC are integrated on a single chip, and wherein a first clock signal for said CCD analog signal processing circuit and a second clock signal for said ADC are generated by a first clock source, and a serial input/output (I/O) circuit, said serial I/O circuit comprising:
  a bidirectional I/O port having a first terminal coupled to a bidirectional data pad;
  a serial to parallel shift register having an input coupled to said bidirectional I/O port, and a plurality of parallel outputs; and
  a parallel to serial shift register having a plurality of parallel inputs coupled to said plurality of digital outputs of said ADC, and an output coupled to said bidirectional I/O port.

10. The CCD signal digitizing circuit of claim 9 wherein said bidirectional I/O port further includes a mode select input coupled to a mode pad and a clock input coupled to an I/O clock pad, and wherein, said serial to parallel and said parallel to serial shift registers each have a clock input coupled to said I/O clock pad.

11. The CCD signal digitizing circuit of claim 10, wherein said parallel to serial shift register includes a second clock input coupled to a clock output of said ADC.

12. A charge coupled device (CCD) signal digitizing circuit comprising:

a CCD analog signal processing circuit including a sampling unit coupled to an amplifier, said CCD analog processing circuit having an input coupled to receive a CCD input signal, and an output;

a multiplexer having a first input coupled to said output of said CCD analog signal processing circuit and an output;

an analog to digital converter (ADC) having an input coupled to said output of said multiplexer, and a plurality of digital outputs; and a serial input/output (I/O) circuit coupled to said ADC and said CCD analog signal processing circuit, said serial I/O circuit for serially outputting a digitized signal on said plurality of digital outputs of said ADC, wherein, said CCD analog signal processing circuit, multiplexer, ADC and serial I/O circuit are integrated on a single chip, and wherein, a first clock signal for said CCD analog signal processing circuit and a second clock signal for said ADC are driven by a first clock source.

13. The CCD signal digitizing circuit of claim 12 further comprising:

a programmable switch that couples said output of said multiplexer to said input of said ADC;

a delay element having an input coupled said second clock signal for said ADC, and an output coupled to said first clock signal for said CCD analog signal processing circuit; and a CCD signal reference level sampling circuit coupled to said input of said CCD analog signal processing circuit, said CCD signal reference level sampling circuit receiving a third clock signal from a second clock source that is separate and independent of said first clock source.

14. A charge coupled device (CCD) signal digitizing circuit comprising:

a CCD analog signal processing circuit including a sampling unit coupled to an amplifier, said CCD analog processing circuit having an input coupled to receive a CCD input signal, and an output;

a multiplexer having a first input coupled to said output of said CCD analog signal processing circuit and an output;

an analog to digital converter (ADC) having an input coupled to said output of said multiplexer, and a plurality of digital outputs;

a parallel to serial shift register having a plurality of parallel inputs coupled to said plurality of digital outputs of said ADC, and an output;

a serial to parallel shift register having an input and a plurality of parallel outputs; and a bidirectional output port having a bidirectional terminal coupled to a bidirectional data pad, an input coupled to said output of said parallel to serial shift register, and a output coupled to said input of said serial to parallel shift register, wherein, said CCD analog signal processing circuit, multiplexer, ADC, serial to parallel and parallel to serial shift registers, and said bidirectional port are integrated on a single chip.

* * * * *